United States Patent [19]
Sloane

[11] 3,973,112
[45] Aug. 3, 1976

[54] SYSTEM FOR DETERMINING TRANSFER FUNCTION

[75] Inventor: Edwin A. Sloane, Los Altos, Calif.

[73] Assignee: Time/Data Corporation, Santa Clara, Calif.

[22] Filed: July 29, 1974

[21] Appl. No.: 492,410

[52] U.S. Cl............................. 235/156; 235/150.53; 235/151.3; 324/77 B
[51] Int. Cl.² .................................... G06F 15/34
[58] Field of Search............... 235/181, 150.53, 151, 235/151.3, 156; 325/67; 178/69 A; 324/57, 77; 73/67.2, 71.5, 71.6

[56] References Cited
UNITED STATES PATENTS
3,718,813   2/1973   Williams et al..................... 235/181

OTHER PUBLICATIONS
Depeyrot: Linear System Identification Using Real-Time Deconvolution, IEEE Transactions on Computers, vol. 19, No. 12, pp. 1139–1145, 1970.

Favour et al.: Transient Synthesis for Mechanical Testing, Instruments and Controls Systems Sept. 1970, pp. 125–127.

Primary Examiner—Felix D. Gruber
Attorney, Agent, or Firm—Spensley, Horn, & Lubitz

[57] ABSTRACT

A system for determining the transfer function of a specimen from an input or driving signal and an output or response signal. The driving signal and response signal are each divided into segments or frames of data, each frame of equal duration and a sum is formed for each frame of data. A time-domain to frequency-domain transform is taken of the two sums; the transfer function is then determined from the transformed data.

7 Claims, 7 Drawing Figures

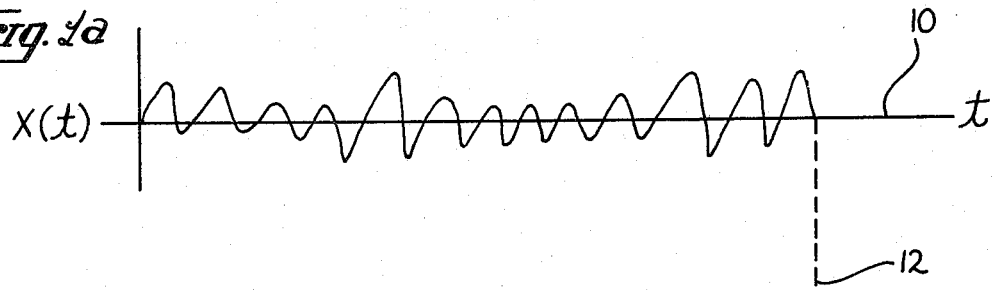
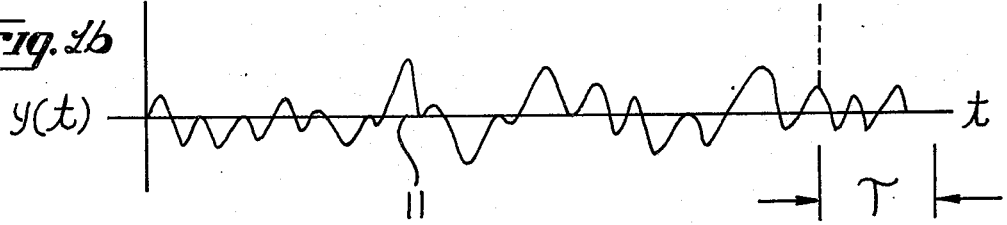
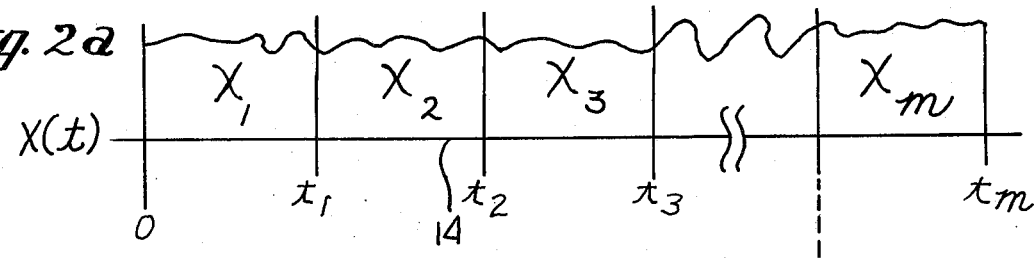
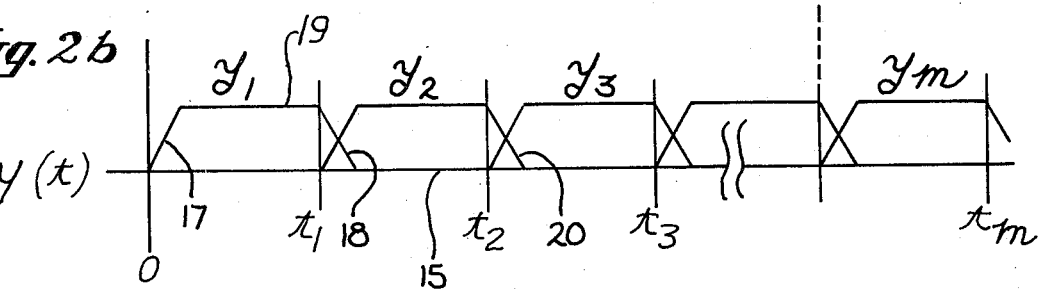

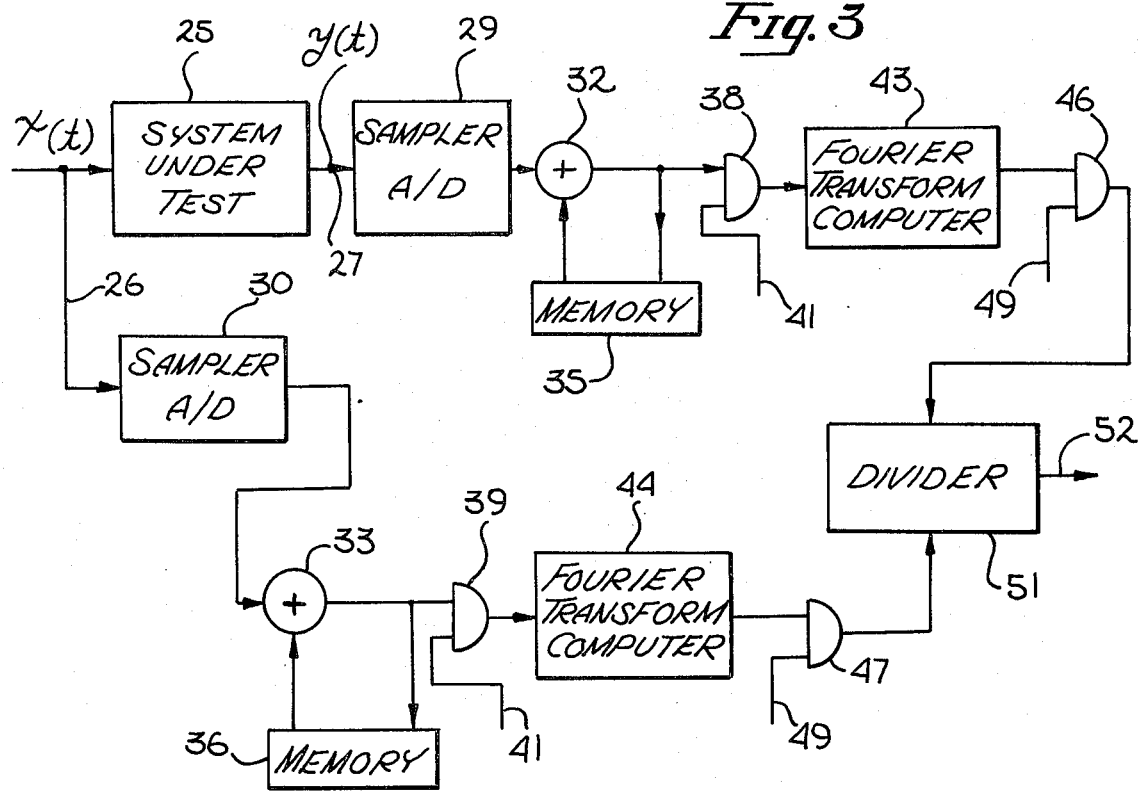
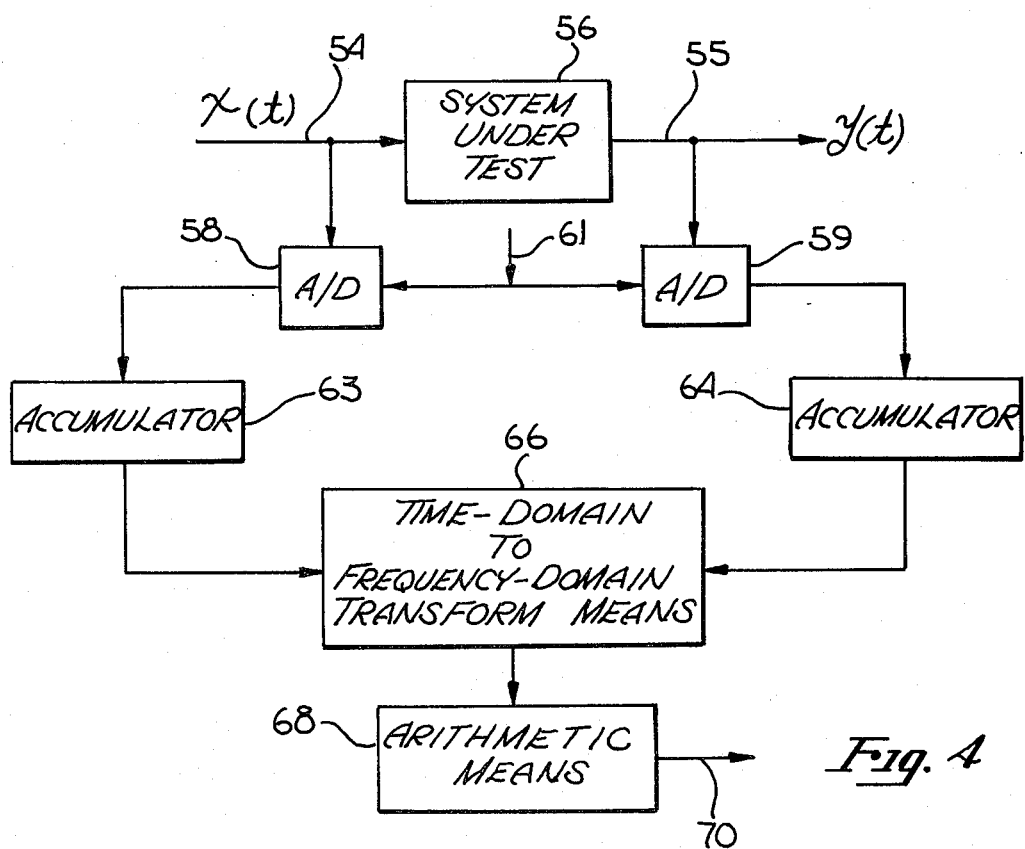

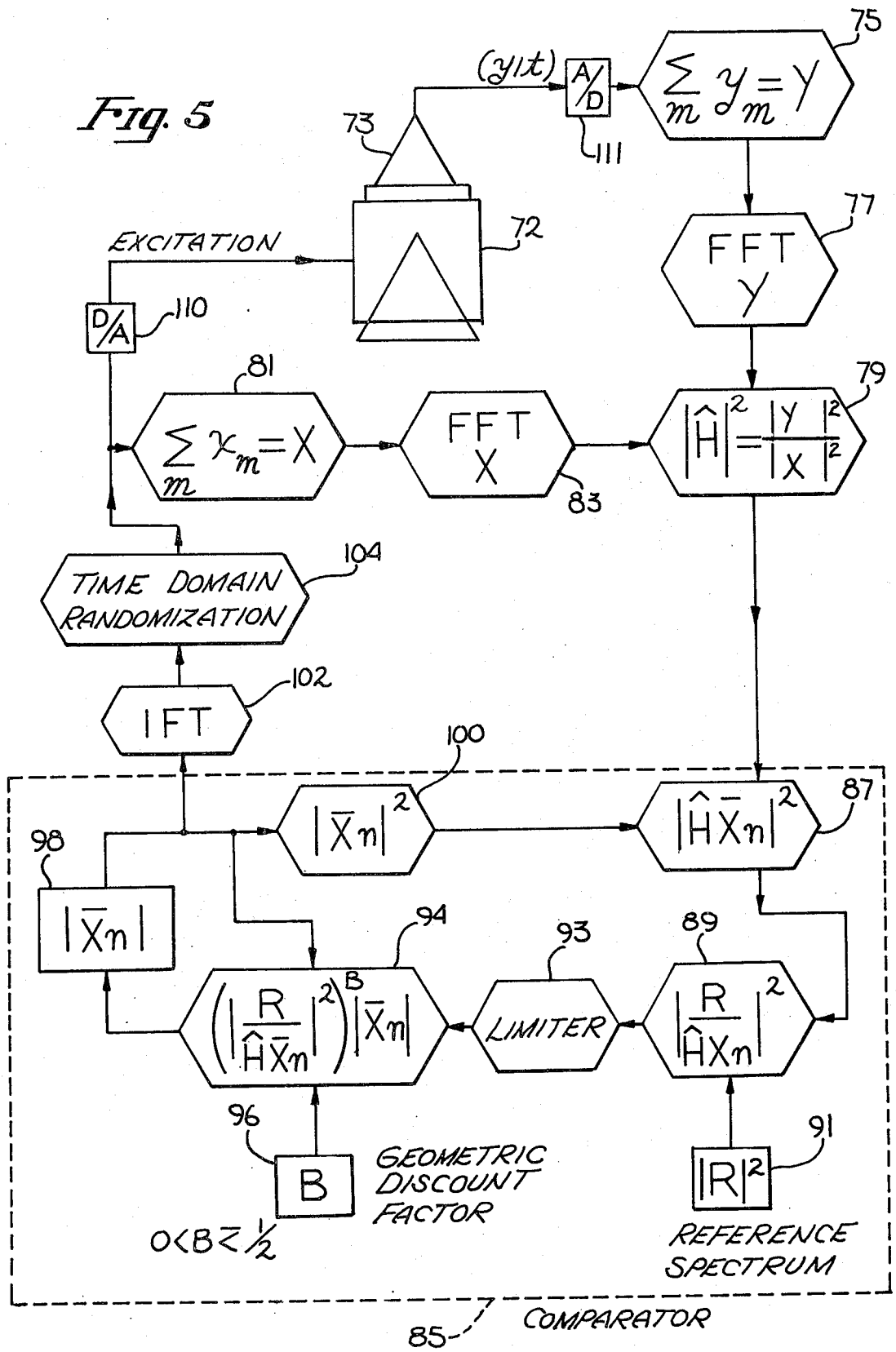

SYSTEM FOR DETERMINING TRANSFER FUNCTION

BACKGROUND OF THE INVENTION

1. Field of the Invention

The invention relates to the field of systems and methods for determining transfer functions.

2. Prior Art

In modern technology it is sometimes desirable, and often necessary, to determine or approximate the transfer function of an object or specimen. The transfer function is used for structural analysis of aircraft, space vehicles and countless other structures; for vibration and environmental testing and in other applications. In many, if not most, practical applications, a theoretical determination of the transfer function of a complex structure may not readily be computed, and the transfer function, if obtainable, must be determined from empirical data. Typically, the structure is subjected to some known driving signal, such as an impulse, and the response of the structure is then measured. From a comparison of the input signal to the response signal the transfer function is then determined.

Generally, in the computation of transfer functions a predetermined segment of the input or driving signal is compared with a predetermined segment of response signal. In the prior art the input signal is often divided into a plurality of equal frames, as is the response signal, and input signals are compared with corresponding response signals for the calculation of the transfer function. Implicit in this comparison is that the response signals are a complete statement of the response to the driving signal. This simplifying assumption, while providing a convenient computational vehicle, introduces a considerable error into the calculation of the transfer function for many practical complex structures. The variances introduced in the computation by this simplifying assumption will be explained in greater detail in conjunction with FIGS. 1 and 2 in the detailed description of the invention.

SUMMARY OF THE INVENTION

A system is disclosed and described for determining the transfer function of a specimen, such as a complex structure, from an input or driving signal and from an output or response signal. The input is divided into a plurality of periodic frames of data which are summed. The output signal is likewise divided into a plurality of periodic frames of data which are summed. A time-domain to frequency-domain transform, such as a Fourier transform, is taken of each of the sums. From the transformed data the transfer function is then calculated. In some embodiments averages and conjugates of the sums are used for determining the transfer function as a method for eliminating noise.

BRIEF DESCRIPTION OF THE DRAWINGS

FIG. 1a illustrates a typical input or driving signal used to excite a specimen or structure.

FIG. 1b is a response signal showing a response of a specimen to the input signal of FIG. 1a.

FIG. 2a illustrates the method in which an input or driving signal is often treated in the prior art for determining a transfer function.

FIG. 2b illustrates the method by which a response signal is often treated in the prior art for determining a transfer function. FIGS. 1 and 2 are used to illustrate the errors introduced to the computation of the transfer function by prior art techniques.

FIG. 3 is a block diagram which illustrates a system for determining the transfer function of a specimen in accordance with the present invention.

FIG. 4 is a block diagram which is an alternate embodiment of the system illustrated in FIG. 3.

FIG. 5 is a flow diagram of a vibration testing system in which the presently disclosed system for determining the transfer function is utilized to control the vibrations to which a specimen is subjected.

DETAILED DESCRIPTION OF THE INVENTION

First referring to FIG. 1a, an input or driving signal $x(t)$ is shown on abscissa 10. This signal may be an input or driving signal to a vibration testing system such as a shaker table, or it may represent sound or other phenomena to which a specimen, object or structure is subjected. The response of the specimen, structure or object to the signal $x(t)$ is shown on abscissa 11 as $y(t)$ in FIG. 1b. In the case of vibration testing on a shaker system the signal shown on abscissa 11 is readily obtainable from a sensor placed on the specimen.

In many practical applications the driving signal $x(t)$ is not of short duration and may continue over a considerable length of time. As would be expected, the response signal $y(t)$ continues over a period of time which is as long as, or longer than the driving signal. As shown in FIGS. 1a and 1b the driving signal terminates at time 12 while the response signal continues beyond time 12 for a period of time indicated as tau ($\tau$). For most real and practical specimens the specimen continues to respond to a driving force even after the driving force has been terminated. This continued response (shown as tau) is as long as the duration of the impulse response of the specimen.

Referring now to FIG. 2a, generally in the prior art in order to determine the transfer function of a specimen or system the driving signal $x(t)$ is typically divided, for the sake of convenience, into a plurality of equal frames of data. This is illustrated in FIG. 2a on abscissa 14 by the plurality of frames of the driving signal $x(t)$ called $x_1, x_2, x_3 \ldots x_m$. In a similar manner the response of the system is typically divided into the same number of equal frames of data as shown on abscissa 15 by $y_1, y_2, y_3, \ldots y_m$. The transfer function is then computed from Fourier transforms of the quantities $x_1$ and $y_1$; $x_2$ and $y_2$; $x_3$ and $y_3 \ldots x_m$ and $y_m$. The various transfer functions which result from each of the like numbered frames of data are sometimes averaged or otherwise operated upon to obtain a better estimate of the transfer function. U.S. Pat. No. 3,710,082, equation 21 shown in column 13, and the system illustrated in FIG. 7 of that patent are representative of the prior art methods of dividing the driving signal and response signal into a plurality of equal frames of data and then comparing corresponding frames as shown in FIG. 2 of this application.

The segmentation of the driving signal and response signal into a plurality of equal frames of data and the comparison of like numbered frames of data assumes that each like numbered frame is a complete statement, that is, each contains all the information necessary to compute the transfer function. This is seldom the case since for most specimens or systems as illustrated in FIG. 1, the response continues for some period of time after the excitation has ended. This is illustrated graphically in FIG. 2b on abscissa 15. Response 19 which corresponds to frame $y_1$ is assumed for most prior art computations to be the response caused by the driving signal occurring during the frame $x_1$. The response 19 includes an initial transient 17 which does occur during the frame $y_1$ and a terminal response 18 which does not occur during the frame $y_1$. Thus, for the computation of the transfer function from the data contained in frames $x_1$ and $y_1$, the terminal response 18 is not utilized. Moreover, for all frames other than the first frame and the last frame, the computation of the transfer function always includes the terminal response from a preceding frame and excludes the terminal response of the frame under consideration. For example, in calculating the transfer function of the data contained within the frames $x_2$ and $y_2$, terminal response 18 (which is not the response to the signal contained within $x_2$) is utilized nonetheless for the computation of the transfer function and the terminal response 20 (which is a portion of the response to the driving signal contained within frame $x_2$) is not utilized for the computation. This results in inaccuracies in the computation of the transfer function.

These variances result in considerable error in the computation of the transfer function, particularly where the frame durations are shortened relative to the impulse response duration, tau. Consider first the driving signal and response in their entirety illustrated in FIG. 1. If a single frame were utilized and included the entire driving signal and the entire response, the variances described in conjunction with FIG. 2 would not occur. But, as is often the case, the driving signal typically used in the testing of large structures, such as aircrafts and space vehicles, and hence the response signal, are long in duration and must be segmented if a computation is to be performed without an overly complicated and expensive computer. In fact, in most practical computational means, it is desirable to shorten the frame size to the shortest possible duration since this limits the memory required by the computational means and allows more convenient processing. However, as the frame size is decreased, the errors caused by the above discussed variances increases, making the prior art technique above described even less accurate. As will be seen, the present invention provides a system and method for determining the transfer function where a plurality of frames are utilized and where the frame size may be equal to or greater than the duration of the impulse response, of the specimen under investigation.

In the prior art there has been considerable teaching which points away from the addition or averaging of time-domain functions in order to compute frequency-domain representations, such as transfer functions. The present invention recognizes and implements the fact that time-domain representations of the driving signal and response signal may be each divided into a plurality of equal frames of data, and added. That is, all the driving signal frames are added to form a single sum frame and all the response signal frames are added to form a single sum frame. Then after an appropriate time-domain to frequency-domain transform is taken of each of the sums, the transfer function is computed (although not preferred, it is possible to transform each frame of data of the driving signal and the response signal, and then sum the respective transforms to obtain the transformed single sum frames, from which the transfer function is computed). The period of the equal frames of data should be at least equal to the period of the impulse response of the system or structure under test. This minimum duration for the frames of data is generally experimentally determined or estimated from known design parameters.

While a rigorous mathematical proof for the above described method, particularly for the case where the response signal includes noise, will not be undertaken, some basic notations and explanation shall be given. First, it will be assumed that the driving signal previously represented as $x(t)$ in its analog form is represented by M periodic frames of data each having a period at least equal to the period of the impulse response of the system under test. Also, the signal $x(t)$ is represented within each frame of data by N periodic samples. If each of the periodic frames of data are added to one another, that is, each sample of each frame of data is added to the corresponding sample in the other frames of data, the total sum frame may be written as:

$$x(m) = \sum_{m=0}^{M-1} x(mN+n) \qquad (1)$$

The corresponding total sum frame of the response signal $y(t)$ may be written as:

$$y(n) = \sum_{m=0}^{M-1} y(mN+n) \qquad (2)$$

If a time-domain to frequency-domain transform, such as a Fourier transform, is taken of each of these sums, the transformed sums may be written as:

$$X(k) = \sum_{n=0}^{N-1} x(n) e^{-\frac{j2\pi kn}{N}} \qquad (3)$$

$$Y(k) = \sum_{n=0}^{N-1} y(n) e^{-\frac{j2\pi kn}{N}} \qquad (4)$$

The transfer function may be written as:

$$H(k) = \frac{Y(k)}{X(k)} \qquad (5)$$

The estimated transfer function may be written as:

$$\hat{H}(k) = H(k) + \epsilon(k) \qquad (6)$$

As may be seen, the estimated transfer function is equal to the quotient of the transformed sums plus some additive factor, which is the result of the noise introduced generally by the testing environment such as a shaker table. Techniques for operating upon or otherwise "averaging" a plurality of the estimated transfer functions to minimize the effect of the noise will be discussed later in the application.

A system for determining the transfer function which implements the above equations is illustrated in FIG. 3. The input signal or driving signal $x(t)$ is shown on line 26. This signal is applied to the system under test 25 and also to a sampler 30. The system under test 25 may include a shaker table and specimen with means for sensing the response of the specimen as will be discussed in conjunction with FIG. 5. More generally $x(t)$ may be a random, swept sine, or other excitation applied to a structure or the like and $y(t)$ shown on line 27 may be the sensed response.

The response $y(t)$ is supplied to a sampler 29 which may be identical to the sampler 30. Samplers 29 and 30 sample the analog signals applied to them and in the presently preferred embodiment, convert the samples to digital form. Thus, the samplers 29 and 30 may be analog-to-digital converters. In the preferred embodiment the sampling is periodic and corresponds to the indices $n$ and N shown in equations 1 and 2.

Adder 32 performs the function of adding the output from memory 35 with the output from sampler 29. The sum signal is applied to a gate 38. Memory 35 is a recirculating memory; adder 32 may be any one of a plurality of known adding means for adding two digital signals. In a similar fashion adder 33 sums the output from recirculating memory 36 with the output from the sampler 30 with the sum signal being applied to the gate 39. Gates 38 and 39 are clocked with a control signal applied to lead 41 as is commonly done, and the output from gates 38 and 39 are applied to the Fourier transform computers 43 and 44, respectively. It should be noted that the outputs from gates 38 and 39 correspond to the sums of the frames shown in equations 1 and 2.

The Fourier transform computers 43 and 44 may be any known means for obtaining a Fourier transform of an input signal. Numerous computer programs are well known in the art for performing fast Fourier transforms (FFT), and hence, a general purpose digital computer may be utilized. Other hard-wired computers are known, such as disclosed in U.S. Pat. No. 3,638,004. A computer embodying the algorithm disclosed in this patent is commercially available from Time/Date Corporation of Palo Alto, California (Model TD-90 or TD-100).

The output from Fourier transform computer 43 is supplied to a gate 46 while the output from Fourier transform computer 44 is applied to a gate 47. Gates 46 and 47 are controlled by control line 49; the output of these gates is applied to a digital divider 51. Divider 51 performs the function of dividing the number represented by the digital signal appearing at the output of gate 46 by the output appearing at gate 47. The quotient which appears on line 52 corresponds to the transfer function shown in equation 5.

Referring to FIG. 4, an alternate embodiment of the system of FIG. 3 is illustrated and again includes an input or driving signal $x(t)$ shown on line 54 and an output signal or response signal which is the response of the system under test 56 to the driving signal shown on line 55. The driving signal and response signal are coupled to analog-to-digital converters 58 and 59, respectively. The sampling rate of these converters is controlled by a control signal applied to line 61. The output from the analog-to-digital converter 58 is accumulated in accumulator 63. Likewise, the output from the analog-to-digital converter 59 is accumulated in accumulator 64. The accumulators 63 and 64 accumulate consecutive frames of data, and hence the output from accumulators 63 and 64 correspond to the sums shown in equations 1 and 2. The analog-to-digital converters and accumulators may be ordinary well known digital means. A single time-domain to frequency-domain transform means 66 is utilized in the embodiment of FIG. 4. This means may be of a similar type as in either of the Fourier transform computers 43 and 44 discussed in conjunction with FIG. 3. In the transform means 66 separate transforms are taken of the output of accumulator 63 and the output of accumulator 64. The transformed data is applied to the arithmetic means 68, the output of which is line 70. Arithmetic means 68 may be a divider such as divider 51 shown in FIG. 3, or may be other digital means for performing common arithmetic functions. As will be discussed, the transfer function may be estimated with other functions than the division shown by equation 5 and in such embodiments arithmetic means 68 will implement the other equations disclosed below. In any event, only simple multiplication, division or addition are required of the arithmetic means, hence any one of numerous well known means may be utilized for performing this function. The transform means 66, for some of the equations described below, may be also utilized to compute the complex conjugate of the driving signal, this computation also being well known in the art and implemented by numerous known programs or hard-wired computers.

Somewhat implicit in the above discussion is that the entire sampled driving signal is summed as is the entire sampled output signal in order to obtain the transfer function. In practice, some predetermined section of driving signal and some predetermined section of response signal are utilized, particularly where the driving signal and response signal are continuous. In practice it has been found to be desirable to divide the driving signal and response signal into a plurality of sections of data in order to more accurately compute the transfer function. Each section is treated in the above described manner, that is, each section is divided into a plurality of M frames of data which are summed. For the following discussion, FIG. 2 represents one of the L sections of the drive and response signals divided into M frames. The sums in each case are transformed to the frequency-domain as shown by the systems of FIGS. 3 and 4. Depending upon the system under test, the "tradeoffs" to be made in computing the transfer function and the type of equipment available for the computation, an empirical determination of L and M may be made. It has been found that minimum error in computing the transfer function is obtained when the error attributable to the selection of L approximately equals the error attributable to the selection of M. The following 7 equations illustrate 7 different computational techniques for determining the transfer function which may be readily implemented by arithmetic means 68. The asterik appearing in some of the equations indicates that the complex conjugate of the indicated term is used in the computation. The estimate of the transfer function is indicated by the symbol $\hat{H}$. $\hat{H}$ may be calculated in a plurality of ways as shown in the equations below.

$$\hat{H} = \frac{\sum_l (\sum_m X_{m,l})(\sum_m Y_{m,l})}{\sum_l \sum_m |X_{m,l}|^2} \qquad (7)$$

$$\hat{H} = \frac{\sum_l (\sum_m X_{m,l})(\sum_m Y_{m,l})}{\sum_l |\sum_m X_{m,l}|^2} \qquad (8)$$

$$|\hat{H}|^2 = \frac{\sum_l |\sum_m Y_{m,l}|^2}{\sum_l |\sum_m X_{m,l}|^2} \qquad (9)$$

$$\sum_l |\sum_m Y_{m,l}|^2$$

-continued $$|\hat{H}|^2 = \frac{\sum\limits_{l}\sum\limits_{m}|X_{m,l}|^2}{\sum\limits_{l}\sum\limits_{m}|X_{m,l}|^2} \quad (10)$$

$$|\hat{H}|^2 = \sum_{l}\left[\frac{\left|\sum\limits_{m}Y_{m,l}\right|^2}{\left|\sum\limits_{m}X_{m,l}\right|^2}\right] \quad (11)$$

$$\hat{H} = \sum_{l}\left[\frac{\sum\limits_{m}X_{m,l}\sum\limits_{m}Y_{m,l}}{\left|\sum\limits_{m}X_{m,l}\right|^2}\right] \quad (12)$$

$$\hat{H} = \sum_{l}\left[\frac{\sum\limits_{m}Y_{m,l}}{\sum\limits_{m}X_{m,l}}\right] \quad (13)$$

The following equation which may be readily implemented in arithmetic means 68 may be utilized as a spectral estimator.

$$\hat{S}_{x,y} = \frac{1}{LM}\sum_{l=1}^{L}(\sum_{m=1}^{M}X_{m,l})(\sum_{m=1}^{M}Y_{m,l}) \quad (14)$$

Equation 7 above has been found to be one of the most effective means for estimating the transfer function insofar as it reduces the effect of the noise term shown in equation 6; on the other hand equation 11, while not particularly effective in reducing the effects of noise, is easier to implement.

One application in which the presently disclosed system and method for determining a transfer function may be used is in controlling a vibration testing environment or apparatus. U.S. Pat. No. 3,710,082 discloses a system which utilizes the output signal of a Fourier transformer to subject a specimen to vibrations having a predetermined spectral content. FIG. 5 of the within invention discloses a system in block diagram/flow chart form in which the present invention is utilized to control a shaker table 72. The table 72 subjects a specimen 73 to an excitation signal $x(t)$.

The response signal of the specimen, $y(t)$, is converted from analog to digital format as indicated in block 111. Any conventional analog to digital converter can perform the function at block 111. The digital signals from block 111 are applied to block 75. Within the block 75 the plurality of periodic frames of data are formed and summed as indicated by the equation in block 75, in digital form in the presently preferred embodiment.

This sum corresponding to equation 2. Block 81 performs the same function upon the excitation or driving signal and produces a sum which corresponds to the sum shown by equation 1. Fast Fourier transform block 77 performs the time-domain to frequency-domain transform and in particular a Fourier transform, upon the sums generated by block 75. In a like manner the fast Fourier transform block 83 performs a Fourier transform upon the output of block 81. The fast Fourier transform block 77 and 83 functions may be performed by a common means which is time shared as opposed to the illustrated separate blocks. Furthermore, the function of blocks 77 and 83 can be performed by a Fourier transform computer similar to transform computer 43 in FIG. 3.

The outputs of blocks 77 and 83 are converted into their absolute values, squared, and divided one into the other as indicated in block 79 thereby outputting a signal from block 79 which corresponds to Ĥ. The function of block 79 can be performed by an arithmetic means, properly implemented, similar to the arithmetic means 68 of FIG. 4. With the illustrated embodiment of FIG. 5, the square of the transfer function is utilized to facilitate further processing. Note that any of the equations 6 through 12 can be implemented in block 79 to compute the transfer function. The computation shown within block 79 corresponds to equation 10.

Within comparator 85 the response of the specimen to a known driving signal is compared with a reference spectrum in a closed loop fashion in order to generate an excitation signal which will subject the specimen to the reference spectrum.

Specifically, the output from block 79 is multiplied with the output from block 100 as indicated within block 87. The output or product from block 87 is then compared with the absolute value of the reference spectrum squared stored within block 91. This comparison for the illustrated embodiment occurs, as indicated, within block 89 by dividing the output at 87 into the value stored in block 91. Other types of comparisons may likewise by utilized such as those discussed in U.S. Pat. No. 3,710,082.

The output from block 89 is prevented from varying beyond predetermined limits as indicated in block 93. These predetermined limits may be experimentally determined and represent the predicted range of the output of block 89. As previously mentioned, equation 10 is utilized for the embodiment of FIG. 5 for determining the transfer function and this method for determining the transfer function, while easier to implement, does not eliminate the effects of noise as well as some of the other methods. Since some extraneous noise will be present in the system, the variances are limited in block 93. Any known digital limiting means may be utilized to perform the function of block 93. For the initial condition wherein there is substantially no excitation and response signals present, the excitation $|X_n|$ is developed from the reference spectrum R in block 89.

The output of block 93 is applied to block 94 along with a constant B signal from constant generator 96. The output of block 93 is geometrically averaged by raising the output of block 93 to the power of B and multiplying the resultant by the absolute value of the excitation as indicated in block 94. For the presently preferred embodiment, as indicated, B is larger than zero but no greater than ½.

The output of block 94 is the absolute value of excitation signal in the frequency-domain as illustrated in block 98. This signal is applied to block 100. The signal is squared as indicated in block 100 and applied to block 87 as previously discussed. This signal is transformed to the time-domain by use of a inverse Fourier transform as indicated by block 102 utilizing known techniques as previously discussed. The output of block 102 is the excitation signal and is converted from digital to analog format as indicated by block 110. Any convention digital to analog converter can perform the function of block 110. The analog excitation signal is applied to the shaker table 72. In order that the computation need not be performed continually in "real time", a single frame of driving signal from block 102 may be used a plurality of times as a driving signal for shaker table 72 by randomizing a single frame of data in the time-domain as described in U.S. Pat. No. 3,348,115 and assigned to the assignee of the present application. This time-domain randomization is illustrated as block 104 in FIG. 5.

Thus, a system has been disclosed for determining the transfer function of a specimen, structure or the like from an input or driving signal and an output or response signal. The system illustrated in FIG. 5 utilizes the present invention in order to subject the specimen 73 to the reference spectrum R. Simple summation in the time-domain is utilized, thus limiting the number of transformations into the frequency-domain required by prior art techniques. Moreover, variances associated with computing the transfer function utilizing prior art techniques are minimized.

I claim:

1. A system for determining the transfer function of a specimen, structure or the like from an input or driving signal and an output or response signal comprising:
   first addition means for adding periodic frames of data corresponding to said input signal to provide an input signal to provide an input sum signal;
   second addition means for adding periodic frames of data corresponding to said output signal to provide an output sum signal;
   transform means for converting a time-domain signal to a frequency-domain signal coupled to said first and second addition means, said transform means further being inhibited until said input sum signal and output sum signal are provided; arithmetic means for forming arithmetic functions coupled to said transform means; whereby said transfer function may be computed from said transformed input sum signal and said transformed output sum signal.

2. The system defined in claim 1 wherein said arithmetic means comprises a means for dividing said transformed output sum signals by said transformed input sum signals.

3. In a control system which utilizes a transfer function or the like to control the vibrations to which a specimen is subjected and which includes an excitation signal for driving said specimen and a response signal representative of the response of said specimen to said excitation signal, computational means comprising:
   a computer means for adding periodic frames of data of said excitation signal and for adding periodic frames of data of said response signal; and
   transform means coupled to said computational means for determining the Fourier transform of the sums computed by said computer means, said transform means being inhibited until said sums are computed by said computational means; whereby the transfer function or the like may be estimated from the transformed sums.

4. In a vibration control system which subjects a specimen to a predetermined or reference spectrum, means for generating an excitation signal from a response signal comprising:
   first summation means for summing periodic frames of data of said excitation signal;
   second summation means for summing periodic frames of data of said response signal;
   direct transform means for obtaining the Fourier transform of said summed excitation signal and said summed response signal, when said sums are available from said first and second summation means;
   arithmetic means for performing arithmetic function on summed signals;
   third means for generating an output signal by comparing the output of said arithmetic means with said reference spectrum;
   inverse Fourier transform means for converting a frequency-domain function to a time-domain function coupled to said third means to generate an output signal which may be utilized as an excitation signal.

5. The control system defined in claim 4 wherein said direct and inverse Fourier transforms are generated by the same transform means.

6. A method for determining the transfer function of a specimen, structure or the like from an input or driving signal and an output or response signal comprising:
   adding periodic frames of data corresponding to said input signal to provide an input sum signal;
   adding periodic frames of data corresponding to said output signal to provide an output sum signal;
   transforming both the input sum signal and the output sum signal from time-domain signals to frequency domain signals; and
   computing the transfer function from said transformed output sum signal and said transformed input sum signal.

7. The method defined in claim 6 wherein said computing step comprises dividing said transformed output sum signal by said transformed input sum signal.

* * * * *